United States Patent
Kido et al.

(10) Patent No.: US 12,409,498 B2
(45) Date of Patent: Sep. 9, 2025

(54) CEMENTED CARBIDE AND CUTTING TOOL

(71) Applicants: Sumitomo Electric Hardmetal Corp., Itami (JP); Sumitomo Electric Industries, Ltd., Osaka (JP)

(72) Inventors: Yasuki Kido, Itami (JP); Yoshihiro Kimura, Osaka (JP); Atsuhiro Yoneda, Itami (JP); Yuki Tanaka, Itami (JP); Keiichi Tsuda, Itami (JP)

(73) Assignees: SUMITOMO ELECTRIC HARDMETAL CORP., Itami (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/840,632

(22) PCT Filed: Jan. 30, 2024

(86) PCT No.: PCT/JP2024/002896
§ 371 (c)(1),
(2) Date: Aug. 22, 2024

(87) PCT Pub. No.: WO2025/163758
PCT Pub. Date: Aug. 7, 2025

(65) Prior Publication Data
US 2025/0242415 A1 Jul. 31, 2025

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0605* (2013.01); *C23C 14/325* (2013.01); *C23C 16/271* (2013.01); *B23B 2224/00* (2013.01)

(58) Field of Classification Search
None
See application file for complete search history.

(56) References Cited

U.S. PATENT DOCUMENTS

| 12,104,229 | B1 * | 10/2024 | Ishida ............... C22C 29/067 |
| 2018/0222804 | A1 | 8/2018 | Kido et al. |
| 2023/0278109 | A1 | 9/2023 | Kido et al. |

FOREIGN PATENT DOCUMENTS

| CN | 111378857 A | 7/2020 |
| JP | 2004-232000 A | 8/2004 |

(Continued)

OTHER PUBLICATIONS

International Search Report and Written Opinion mailed on Mar. 12, 2024, received for PCT Application PCT/JP2024/002896, filed on Jan. 30, 2024, 13 pages including English Translation.

*Primary Examiner* — Colin W. Slifka
(74) *Attorney, Agent, or Firm* — XSENSUS LLP

(57) ABSTRACT

A cemented carbide consists of a first hard phase, second hard phases, and a binder phase, wherein the first hard phase is composed of tungsten carbide grains, a D10 and a D90 of grain sizes of the tungsten carbide grains are 0.40 μm or more and 2.00 μm or less respectively, the second hard phases are composed of at least one first compound selected from the group consisting of TaNbC, TaNbN, TaNbCN, TiCN, TiNbC, TiNbN, and TiNbCN, the cemented carbide includes 0.30% to 1.60% by volume of the second hard phases, an average of circularities of the second hard phases is 0.10 to 0.32, a standard deviation of the circularity is 0.094 to 0.130, the binder phase includes 50% by mass or more of cobalt, and the cemented carbide includes 8.0% to 12.0% by volume of the binder phase.

7 Claims, 2 Drawing Sheets

(51) Int. Cl.
*C23C 14/32* (2006.01)
*C23C 16/27* (2006.01)

(56) References Cited

FOREIGN PATENT DOCUMENTS

| | | |
|---|---|---|
| JP | 2017-088917 A | 5/2017 |
| JP | 2019-090098 A | 6/2019 |
| JP | 7283636 B1 | 5/2023 |
| WO | 2017/191744 A1 | 11/2017 |

* cited by examiner

CEMENTED CARBIDE AND CUTTING TOOL

CROSS-REFERENCE TO RELATED APPLICATION

The present application is based on PCT filing PCT/JP2024/002896, filed Jan. 30, 2024, the entire contents of which are incorporated herein by reference.

TECHNICAL FIELD

The present disclosure relates to a cemented carbide and a cutting tool.

BACKGROUND ART

Conventionally, a cemented carbide, which includes a first hard phase containing tungsten carbide (WC) as a main component, a second hard phase that contains, as a main component, a compound containing a plurality of metal elements including tungsten and one or more elements selected from carbon, nitrogen, oxygen, and boron, and a binder phase containing an iron group element as a main component, has been used for materials of cutting tools.

CITATION LIST

Patent Literature

PTL 1: WO2017/191744

SUMMARY OF INVENTION

A cemented carbide of the present disclosure is a cemented carbide consisting of a first hard phase, a plurality of second hard phases, and a binder phase,
  wherein the first hard phase is composed of a plurality of tungsten carbide grains,
  a D10 of grain sizes of the tungsten carbide grains is 0.40 μm or more,
  a D90 of grain sizes of the tungsten carbide grains is 2.00 μm or less,
  the second hard phases are composed of at least one first compound selected from the group consisting of TaNbC, TaNbN, TaNbCN, TiCN, TiNbC, TiNbN, and TiNbCN,
  the cemented carbide includes 0.30% by volume or more and 1.60% by volume or less of the second hard phases,
  in a cross section of the cemented carbide, an average of circularities of the second hard phases is 0.10 or more and 0.32 or less,
  a standard deviation of the circularity is 0.094 or more and 0.130 or less,
  the binder phase includes 50% by mass or more of cobalt, and
  the cemented carbide includes 8.0% by volume or more and 12.0% by volume or less of the binder phase.

DETAILED DESCRIPTION

Figure 1:
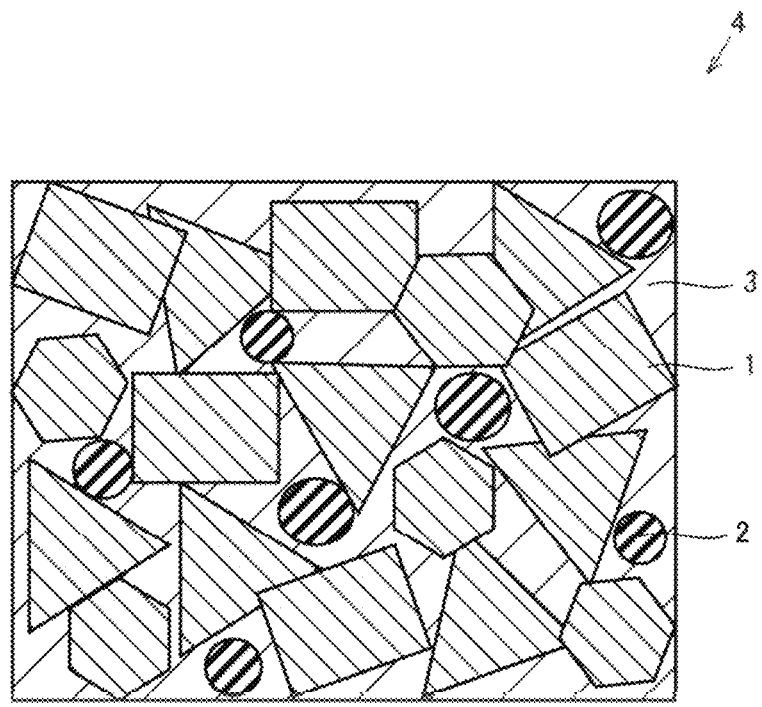
FIG. 1 is a view showing a representative configuration example of a cemented carbide according to Embodiment 1.

Problem to be Solved by the Present Disclosure

When aluminum is processed with a cutting tool that includes a cemented carbide containing a second hard phase as a material, an expansion of tool damages caused by welding and an increase in cutting resistance proceed, which tended to decrease a tool life.

Therefore, an object of the present disclosure is to provide a cemented carbide that enables a longer life of cutting tools even in processing of aluminum in the case where it is used as a material for cutting tools, and a cutting tool comprising the same.

Advantageous Effect of the Present Disclosure

According to the present disclosure, it is possible to provide a cemented carbide that enables a longer life of cutting tools even in processing of aluminum in the case where it is used as a material for cutting tools, and a cutting tool comprising the same.

Description of Embodiments

First, embodiments of the present disclosure will be listed and described.
  (1) A cemented carbide of the present disclosure is
    a cemented carbide consisting of a first hard phase, a plurality of second hard phases, and a binder phase.
    wherein the first hard phase is composed of a plurality of tungsten carbide grains,
    a D10 of grain sizes of the tungsten carbide grains is 0.40 μm or more,
    a D90 of grain sizes of the tungsten carbide grains is 2.00 μm or less,
    the second hard phases are composed of at least one first compound selected from the group consisting of TaNbC, TaNbN, TaNbCN, TiCN, TiNbC, TiNbN, and TiNbCN,
    the cemented carbide includes 0.30% by volume or more and 1.60% by volume or less of the second hard phases.
    in a cross section of the cemented carbide, an average of circularities of the second hard phases is 0.10 or more and 0.32 or less,
    a standard deviation of the circularity is 0.094 or more and 0.130 or less,
    the binder phase includes 50% by mass or more of cobalt, and
    the cemented carbide includes 8.0% by volume or more and 12.0% by volume or less of the binder phase.
  According to the present disclosure, it is possible to provide a cemented carbide that enables a longer life of a cutting tool even in processing of aluminum in the case where it is used as a material for cutting tools.
  (2) In the above (1), the cemented carbide may include 0.08% by mass or more and 0.5% by mass or less of chromium.
  Chromium is derived from chromium carbide ($Cr_3C_2$) that is used as a grain growth inhibitor in manufacturing a cemented carbide. When the cemented carbide contains chromium within the above range, hardness of the cemented carbide is improved, and a life of a cutting tool including the cemented carbide is further improved.

(3) In the above (1) or (2), the binder phase may include either iron or nickel or both iron and nickel.

According to this, the toughness of the cemented carbide is improved, and a life of the cutting tool that includes the cemented carbide is further improved.

(4) A cutting tool of the present disclosure is a cutting tool comprising the cemented carbide according to any of (1) to (3).

According to the present disclosure, it is possible to provide a cutting tool having a longer life even in processing of aluminum.

(5) The above (4) may include a base body composed of the cemented carbide and a coating film provided on the base body. This further improves the life of the cutting tool.

(6) The above (4) or (5) may include a base body composed of the cemented carbide and a cutting edge member fixed on the base body. This further improves the life of the cutting tool.

(7) In the above (6), the cutting edge member may be composed of a cubic boron nitride sintered material or a diamond. This further improves the life of the cutting tool.

Details of Embodiments of the Present Disclosure

Hereinafter, specific examples of the cemented carbide and cutting tool of the present disclosure will be described with reference to drawings. In the drawings of the present disclosure, the same reference signs represent the same portions or equivalent portions. In addition, dimensional relationships such as length, width, thickness, and depth are changed as appropriate for clarity and simplicity in the drawings and do not necessarily represent actual dimensional relationships.

In the present disclosure, the expression "A to B" represents A or more and B or less, and in the case where no unit is indicated for A and a unit is indicated only for B, the unit of A is the same as the unit of B.

In the case where a compound or the like is expressed by a chemical formula in the present disclosure and an atomic ratio is not particularly limited, it should be assumed that all the conventionally known atomic ratios are included, and the atomic ratio is not necessarily limited only to one in the stoichiometric range.

In the present disclosure, in the case where one or more numerical values are each provided as a lower limit and an upper limit of a numerical range, it is considered that a combination of any one of the numerical values provided in the lower limit and any one of the numerical values provided in the upper limit is also disclosed.

Embodiment 1: Cemented Carbide

As shown in FIG. 1, a cemented carbide 4 according to one embodiment of the present disclosure (hereinafter, also referred to as "Embodiment 1") is a cemented carbide 4 consisting of a first hard phase 1, a plurality of second hard phases 2, and a binder phase 3,
wherein first hard phase 1 is composed of a plurality of tungsten carbide grains,
a D10 of grain sizes of the tungsten carbide grains is 0.40 µm or more.
a D90 of grain sizes of the tungsten carbide grains is 2.00 µm or less,
second hard phases 2 are composed of at least one first compound selected from the group consisting of TaNbC, TaNbN, TaNbCN, TiCN, TiNbC, TiNbN, and TiNbCN,
cemented carbide 4 includes 0.30% by volume or more and 1.60% by volume or less of second hard phases 2,
in a cross section of cemented carbide 4, an average of circularities of second hard phases 2 is 0.10 or more and 0.32 or less,
a standard deviation of the circularity is 0.094 or more and 0.130 or less,
binder phase 3 includes 50% by mass or more of cobalt, and
cemented carbide 4 includes 8.0% by volume or more and 12.0% by volume or less of binder phase 3.

Use of a cemented carbide of Embodiment 1 as a material of a cutting tool enables a longer life of a cutting tool even in processing of aluminum. The reason for this is not clear, but is assumed to be as follows.

In the cemented carbide of Embodiment 1, in a cross section of the cemented carbide, an average of circularities of the second hard phases is 0.10 or more and 0.32 or less, and a standard deviation of the circularity is 0.094 or more and 0.130 or less. This indicates that the cross section of the second hard phase is different from a perfect circle, and a perimeter of the second hard phase is longer compared to the case where the cross section of the second hard phase is a perfect circle. Therefore, a shape of the second hard phase is also different from a perfect sphere (true sphere), and a surface area of the second hard phase is larger compared to the case where the second hard phases is a perfect sphere. This improves the adhesiveness among the first hard phase, the second hard phases, and the binder phase. Therefore, a cutting tool that includes the cemented carbide of Embodiment 1 as a material for the cutting tool can be prevented from an expansion of tool damages caused by welding even in processing of aluminum, and can have a longer tool life.

<Composition of Cemented Carbide>

The cemented carbide of Embodiment 1 consists of a first hard phase, a plurality of second hard phases, and a binder phase. The cemented carbide can include impurities unless an effect of the present disclosure is impaired. That is, the cemented carbide can consist of the first hard phase, the plurality of second hard phases, the binder phase, and impurities. Examples of the impurities include iron (Fe), molybdenum (Mo), calcium (Ca), silicon (Si), and sulfur(S). A content of an impurity of the cemented carbide (when two or more kinds of impurities are contained, a total of contents thereof) may be 0% by mass or more and less than 0.1% by mass. The content of impurities of the cemented carbide is measured by inductively coupled plasma emission spectroscopy. As a measuring apparatus, "ICPS-8100" (trademark) manufactured by SHIMADZU CORPORATION can be used.

The content of the second hard phases of the cemented carbide of Embodiment 1 is 0.30% by volume or more and 1.60% by volume or less. This improves the welding resistance, heat resistance, and abrasion resistance of the cemented carbide. The content of the second hard phases of the cemented carbide may be 0.40% by volume or more and 1.50% by volume or less, or may be 0.50% by volume or more and 1.40% by volume or less.

The content of the binder phase of the cemented carbide of Embodiment 1 is 8.0% by volume or more and 12.0% by volume or less. This improves the strength of the cemented carbide. The content of the binder phase of the cemented carbide may be 8.1% by volume or more and 11.9% by volume or less, or may be 8.2% by volume or more and 11.8% by volume or less.

The content of the first hard phase of the cemented carbide of Embodiment 1 is a value obtained by subtracting the volumes of the second hard phases and the binder phase from the volume 100% by volume of the entire cemented carbide.

A method for measuring the content of the first hard phase, the content of the second hard phases, and the content of the binder phase of the cemented carbide is as follows.

(A1) The cemented carbide is cut out at any position to expose a cross-section. The cross-section is subjected to mirror surface processing using CROSS SECTION POLISHER (manufactured by JEOL Ltd.).

(B1) A surface to be processed of a cemented carbide is photographed with a scanning electron microscope (SEM) (manufactured by Hitachi High-Tech Corporation, "S-3400N" (trademark)) and a backscattered electron image is obtained. Six backscattered electron images are prepared. The six backscattered electron images are each different in photographed regions. The photographed portion can be optionally set. The conditions are the observation magnification of 5,000 folds and the acceleration voltage of 10 kV.

(C1) The photographed region of (B1) described above is subjected to elementary analysis using an energy dispersive X-ray analyzer attached to SEM (SEM-EDX), to obtain an element mapping image.

(D1) The six backscattered electron images obtained in the above (B1) are imported to a computer using image analysis software (ImageJ, version 1.51j8:https://imagej.nih.gov/ij/) and are subjected to the binarization processing, to obtain six images obtained after the binarization processing. After the images are imported, the display of "Make Binary" on the computer screen is pushed, and then the binarization processing is executed under the conditions previously set in the image analysis software. The first region composed of the first hard phase and the second region composed of the second hard phases and the third hard phase in the image obtained after the binarization processing can be identified by the shade of color. For example, in the image obtained after the binarization processing, the first hard phase is shown by the black region and the second hard phases and the third hard phase are shown by the white region.

(E1) The element mapping image obtained in the above (C1) and the image obtained after the binarization processing obtained in the above (D1) are overlapped, and the respective existence regions of the first hard phase, the second hard phases, and the binder phase are identified on the image obtained after the binarization processing. Specifically, a region, which is shown in black in an image obtained after the binarization processing and in which tungsten (W) and carbon (C) exist in an element mapping image, corresponds to the existence region of the first hard phase. A region, which is shown in white in an image obtained after the binarization processing and in which titanium (Ti) or tantalum (Ta) exists in an element mapping image, corresponds to the existence region of the second hard phases. A region, which is shown in white in an image obtained after the binarization processing and in which cobalt exists in an element mapping image, corresponds to the existence region of the binder phase.

(F1) In each of the six images obtained after the binarization processing, one measurement field having a rectangle of 25.3 μm×17.6 μm is set. The image analysis software is used to measure each area percentage (area %) of the first hard phase, the second hard phases, and the binder phase with an area of the entire measurement field defined as the denominator, in each of the six measurement fields. In the present disclosure, an average of area percentages (area %) of the first hard phase in the six measurement fields, an average of area percentages (area %) of the second hard phases in the six measurement fields, and an average of area percentages (area %) of the binder phase in the six measurement fields correspond to the content (% by volume) of the first hard phase of the cemented carbide, the content (% by volume) of the second hard phases of the cemented carbide, and the content (% by volume) of the binder phase of the cemented carbide, respectively.

As long as measurements are performed on the same sample, it has been confirmed that there is almost no variation in the measurement results even if the above measurements are performed multiple times by changing the selected portion of the measurement field.

<First Hard Phase>
<<Composition>>

In the cemented carbide of Embodiment 1, the first hard phase is composed of a plurality of tungsten carbide grains (hereinafter, also referred to as "WC grains"). The tungsten carbide grains contain not only "pure WC grains (WC that does not completely contain an impurity element, including WC in which the content of the impurity element is less than a limit of detection)" but also "WC grains containing impurities inside thereof unless an effect of the present disclosure is impaired". Examples of the impurities include iron (Fe), molybdenum (Mo), and sulfur(S).

<<Grain Size of Tungsten Carbide Grains>>

A D10 of grain sizes of the tungsten carbide grains is 0.40 μm or more, and a D90 of grain sizes of the tungsten carbide grains is 2.00 μm or less. As a result of this, the cemented carbide has a high hardness, and the abrasion resistance of a cutting tool including the cemented carbide is improved.

The D10 of the tungsten carbide grains may be 0.42 μm or more, or may be 0.44 μm or more. The D90 of grain sizes of the tungsten carbide grains may be 1.98 μm or less, or may be 1.96 μm or less.

In the present disclosure, the D10 and the D90 of the tungsten carbide grains mean D10 (circle equivalent diameter in which the accumulation of frequency based on the number is 10%) and D90 (circle equivalent diameter in which the cumulation of frequency based on the number is 90%) of the circle equivalent diameter that is equivalent to an area of a tungsten carbide grain (Heywood diameter) in a cross section of a cemented carbide, respectively.

In the present disclosure, a method for measuring the D10 and the D90 of the tungsten carbide grains is as follows.

(A2) Six images obtained after the binarization processing are obtained in the same manner as in the method for measuring the contents of the first hard phase and the like of the cemented carbide. Furthermore, in order to remove noise, the display of "Despeckle" on the computer screen is pushed once, and then the display of "Watershed" is pushed. Then, the grain boundary of the first hard phase (tungsten grain) is also distinguished on the image obtained after the binarization processing under the conditions previously set by the image analysis software. When "Analyze Particle" on the computer screen is pushed, a circle equivalent diameter of an area equivalent to a tungsten carbide grain having an area of 0.002 μm$^2$ or more is measured.

(B2) In each of the six images obtained after the binarization processing, one measurement field having a rectangle of 25.3 μm×17.6 μm is set. The above image analysis software is used to measure the D10 and the D90 of a circle equivalent diameter of an area equivalent to a tungsten carbide grain based on all the tungsten carbide grains having an area of 0.002 μm$^2$ or more in the six measurement fields.

In the present disclosure, the D10 and the D90 measured above correspond to the D10 and the D90 of the tungsten carbide grains.

Setting a threshold in the binarization processing can be manually adjusted, but the manual adjustment is not employed in the present measurement method. In the present measurement method, when the display of "Make Binary" is pushed as described above, the binarization processing is executed. The reason for measuring the circle equivalent diameter of an area equivalent to a tungsten carbide grain having an area of 0.002 μm$^2$ or more is because when the present inventors performed measurements, they confirmed that grains having an area of less than 0.002 μm$^2$ often correspond to noise erroneously detected as tungsten carbide grains in the image analysis.

As long as measurements are performed on the same sample, it has been confirmed that there is almost no variation in the measurement results even if the above measurements are performed multiple times by changing the selected portion of the measurement field.

<Second Hard Phase>

<<Composition>>

In Embodiment 1, the second hard phase is composed of at least one first compound selected from the group consisting of TaNbC, TaNbN, TaNbCN, TiCN, TiNbC, TiNbN, and TiNbCN. This improves the welding resistance, heat resistance, and abrasion resistance of the cemented carbide. In the present disclosure, each of TaNbC, TaNbN, TaNbCN, TiCN, TiNbC, TiNbN, and TiNbCN is not limited to a case where a ratio between a total number of atoms of Ta, Nb, and Ti and a total number of atoms of C and N is 1:1, and a conventionally known ratio can be included unless an effect of the present disclosure is impaired.

The second hard phase may be composed of one first compound selected from the group consisting of TaNbC, TaNbCN, TiCN, and TiNbCN.

The second hard phase may contain a metal element such as tungsten (W), chromium (Cr), and cobalt (Co) within a range that an effect of the present disclosure is not impaired. The total content of W, Cr, and Co in the second hard phase may be 0% by mass or more and less than 0.1% by mass. The content of W, Cr, and Co in the second hard phase is measured by ICP emission spectrometry.

A method for measuring the composition of the second hard phase is as follows.

(A3) A cemented carbide at any position is cut into a thin piece using an ion slicer (device: IB09060CIS (trademark) manufactured by JEOL Ltd.), to prepare a sample having a thickness of 30 to 100 nm. An acceleration voltage of the ion slicer is 6 kV in the thin piece processing, and is 2 kV in the finishing.

(B3) A STEM-HAADF (HAADF: high-angle annular dark field) image is obtained by observing the above sample at 50,000 folds with a scanning transmission electron microscope (STEM) (JFM-ARM300F (trademark) manufactured by JEOL Ltd.). The photographed region of the STEM-HAADF image is set to the central part of the sample, that is, a position that does not include a part clearly different in properties from the bulk part (a position where all the photographed regions are the bulk part of the cemented carbide) such as the proximity of the surface of the cemented carbide. As the measurement conditions, the acceleration voltage is 200 kV.

(C3) Next, the STEM-HAADF image is subjected to elemental mapping analysis using EDX attached to STEM, to obtain an element mapping image. A region where tantalum (Ta) or titanium (Ti) and one or both of carbon (C) and nitrogen (N) exist in the element mapping image is identified as the second hard phase, to identify the composition of the second hard phase.

As long as measurements are performed on the same sample, it has been confirmed that there is almost no variation in the measurement results even if the above measurements are performed multiple times by changing the selected portion of the measurement field.

<<Circularity of Second Hard Phase and Standard Deviation of Circularity>>

The cemented carbide of Embodiment 1 contains a plurality of second hard phases. Each of the second hard phases is composed of one first compound grain or an aggregate of a plurality of first compound grains. When the second hard phase is composed of the aggregate of the plurality of first compound grains, the plurality of first compound grains may be composed of one kind of first compound grain or may be composed of two or more kinds of first compound grains.

In a cross section of the cemented carbide of Embodiment 1, an average of circularities of the second hard phases is 0.10 or more and 0.32 or less, and a standard deviation of the circularity is 0.094 or more and 0.130 or less. An average of circularities of the second hard phases may be 0.15 or more and 0.31 or less, or may be 0.17 or more and 0.30 or less. The standard deviation of the circularity may be 0.100 or more and 0.127 or less, or may be 0.110 or more and 0.124 or less.

In the present disclosure, the average of circularities of the second hard phases means an arithmetic mean of circularities of a plurality of second hard phases in the cross section of the cemented carbide. In the present disclosure, the circularity is a value (circle equivalent perimeter/actual perimeter) determined by dividing a circle equivalent perimeter of a second hard phase in the cross section of the cemented carbide by a perimeter in actuality (actual perimeter). It is indicated that as the value of the circularity is smaller, the shape of the second hard phase in the cross section of the cemented carbide is more different from a perfect circle.

In the present disclosure, a method for measuring the average of circularities of the second hard phases in the cross section of the cemented carbide and a method for measuring a standard deviation of the circularity are as follows.

(A4) The cemented carbide is cut out at any position to expose a cross-section. The cross-section is polished using CROSS SECTION POLISHER. The polished surface of the cemented carbide is photographed with SEM to obtain a backscattered electron image. The conditions are the observation magnification of 1,000 folds and the acceleration voltage of 10 kV.

(B4) The photographed region of (A4) described above is subjected to elementary analysis using an energy dispersive X-ray analyzer attached to SEM (SEM-EDX), to obtain an element mapping image. When the backscattered electron image and the element mapping image are overlapped, the second hard phase is identified on the backscattered electron image.

(C4) The backscattered electron image that has identified the second hard phase is imported to a computer using the image analysis software ("Mac-View Version. 5" (trademark) manufactured by MOUNTECH Co., Ltd.). Under the following conditions, the circularity of each second hard phase is measured.

Acquisition mode: color difference
Detection tolerance: 32, Detection accuracy: 0.5
Scanning: density 10×1 time
High cut: effective
Low cut: inverted (D4) Three fields where 30 or more second hard phases can be confirmed are identified. Based on all the second hard phases in the three fields, the average of circularities of the second hard phases and the standard deviation of the circularity are measured. In the present disclosure, the average of circularities of the second hard phases and the standard deviation of the circularity as measured above correspond to the average of circularities of the second hard phases in the cross section of the cemented carbide and the standard deviation of the circularity.

As long as measurements are performed on the same sample, it has been confirmed that there is almost no variation in the measurement results even if the above measurements are performed multiple times by changing the selected portion of the measurement field.

<Binder Phase>
<<Composition>>

In the cemented carbide of Embodiment 1, the binder phase includes 50% by mass or more of cobalt. This can result in the cemented carbide excellent in toughness. The content of cobalt of the binder phase may be 50% by mass or more and 100% by mass or less, may be 60% by mass or more and 90% by mass or less, or may be 70% by mass or more and 80% by mass or less.

A method for measuring the content of cobalt of the binder phase is as follows. An existence region of the binder phase in an element mapping image is identified in the same manner as in (A1) to (E1) of the method for measuring the content of the first hard phase and the like of the cemented carbide described above. In an image of the element mapping image, one measurement field having a rectangle of 24.9 μm×18.8 μm is set. The content of cobalt is measured in the existence region of the binder phase in the measurement field. In the present disclosure, an average of the cobalt contents in the existence regions of the binder phases in the six measurement fields corresponds to the content of cobalt of the binder phase.

As long as measurements are performed on the same sample, it has been confirmed that there is almost no variation in the measurement results even if the above measurements are performed multiple times by changing the selected portion of the measurement field.

The binder phase can contain iron (Fe), nickel (Ni), and the like within a range that does not impair an effect of the present disclosure. The binder phase may contain cobalt, and one or both of nickel and iron. The binder phase may be composed of cobalt, and one or both of nickel and iron.

<Chromium>

The cemented carbide of Embodiment 1 may contain 0.08% by mass or more and 0.5% by mass or less of chromium. The content of chromium of the cemented carbide may be 0.10% by mass or more and 0.48% by mass or less, or may be 0.12% by mass or more and 0.46% by mass or less. The content of chromium of the cemented carbide is measured by ICP emission spectrometry.

<Manufacturing Method>

The cemented carbide of Embodiment 1 can be produced via, for example, a preparation step, a mixing step, a molding step, a sintering step, and a cooling step.

<Preparation Step>

In the preparation step, a raw material powder is prepared. Examples of the raw material powder include WC powder, TaNbC powder, TaNbN powder, TaNbCN powder, TiCN powder, TiNbC powder, TiNbN powder, TiNbCN powder, NbC powder, $Ta_2O_5$ powder, $TiO_2$ powder, Co powder, Ni powder, and Fe powder. These raw material powders are appropriately selected based on the composition of the targeted cemented carbide. As a grain growth inhibitor, chromium carbide ($Cr_3C_2$) powder may be prepared.

An average grain size of the tungsten carbide (WC) powder is 1.0 μm or more and 1.8 μm or less.

An average grain size of the TaNbC powder, the TaNbN powder, the TaNbCN powder, the TiCN powder, the TiNbC powder, the TiNbN powder, the TiNbCN powder, the NbC powder, the $Ta_2O_5$ powder, and the $TiO_2$ powder is 1 μm or more and 2 μm or less. These powders are the raw material powders of the second hard phase.

An average grain size of the Co powder, the Ni powder, and the Fe powder may be 0.1 μm or more and 5 μm or less.

The average grain size of the above raw material powders is an average grain size obtained by the Fisher method.

<Mixing Step>

In the mixing step, raw material powders are mixed at a predetermined proportion to obtain a mixed powder. The mixing proportion of each raw material powder is appropriately adjusted depending on the composition of a targeted cemented carbide. For mixing, a bead mill is used. The mixing conditions are a bead diameter of 1 mm, the number of revolutions of 2,800 rpm, and a mixing time of 6 to 24 hours.

<Molding Step>

In the molding step, the mixed powder is molded to have a desired shape, to thereby obtain a molded body. The molding method and the molding conditions are not particularly limited as long as general method and conditions are employed.

<Sintering Step>

In the sintering step, first, the molded body is heated to 1.450 to 1,520° C., and is retained for 120 minutes. A temperature increase rate at 1,000° C. or more is 5° C./min. The pressure at this time may be in vacuum or may be under the condition of $N_2$ (flow rate of 2 L/min, partial pressure of 5 kPa). Next, the molded body is cooled to 1,200° C. at a temperature decrease rate of −4.5 to −5.5° C./min, to obtain a cemented carbide intermediate.

Next, the cemented carbide intermediate is subjected to a HIP treatment (HIP: Hot Isostatic Pressing). Specifically, a temperature of 1,320° C. and a pressure of 10 MPa are applied to the cemented carbide intermediate for 60 minutes using Ar gas as a pressure medium. Then, it is gradually cooled to obtain a cemented carbide of Embodiment 1. The temperature decrease rate at the time of gradual cooling is not particularly limited as long as a general condition is employed.

Features of Manufacturing Method of Cemented Carbide of Embodiment 1

Employing the above mixing conditions in the method for manufacturing the cemented carbide of Embodiment 1 makes it easy to crack and shear raw material powders. Moreover, a temperature increase rate of 1,000° C. or more is controlled to 5° C./min, a sintering temperature is controlled to 1.450 to 1,520° C.', which is higher than a general sintering temperature, and a temperature decrease rate is controlled to −4.5 to −5.5° C./min. Under the above conditions, the shape of the second hard phase is likely to be different from a true sphere, and it is possible to manufacture the cemented carbide of Embodiment 1 in which an average of circularities of the second hard phases in a cross section of the cemented carbide is 0.10 or more and 0.32 or less, and a standard deviation of the circularity is 0.094 or more and 0.130 or less. This is found by the present inventors as a result of diligent studies.

Embodiment 2: Cutting Tool

A cutting tool of one embodiment of the present disclosure (hereinafter, also referred to as "Embodiment 2") is a cutting tool including the cemented carbide of Embodiment 1. In the cutting tool of Embodiment 2, the cemented carbide of Embodiment 1 may constitute the whole of these tools or may constitute a part thereof. Examples of the cutting tool in which the cemented carbide of Embodiment 1 constitute a part of the cutting tool include: a cutting tool including any base body and a cutting edge member composed of the cemented carbide of Embodiment 1 fixed on the base body; or a cutting tool including a base body composed of the cemented carbide of Embodiment 1 and any cutting edge member fixed on the base body.

The cutting tool of Embodiment 2 can have a longer tool life even in processing of aluminum. The reason for this is not clear, but is assumed to be as follows.

When aluminum is processed with a cutting tool that includes a cemented carbide containing a conventional second hard phase as a material, an expansion of tool damages caused by welding and an increase in cutting resistance proceed, which tended to decrease a tool life. In the cemented carbide of Embodiment 1, adhesiveness among the first hard phase, the second hard phases, and the binder phase is improved. Therefore, the cutting tool of Embodiment 2 including the cemented carbide of Embodiment 1 as a material for the cutting tool can be prevented from an expansion of tool damages caused by welding even in processing aluminum and can have a longer tool life.

The kind of cutting tool is not particularly limited. As the cutting tool, cutting bits, drills, end mills, indexable cutting inserts for milling, indexable cutting inserts for turning, metal saws, gear cutting tools, reamers, or taps, etc. can be exemplified. As shown in FIG. 3, cutting tool 10 of Embodiment 2 can exert excellent effects in the case of, for example, end mills. Base body 5 of cutting tool 10 shown in FIG. 2 is composed of the cemented carbide of Embodiment 1.

Figure 2:
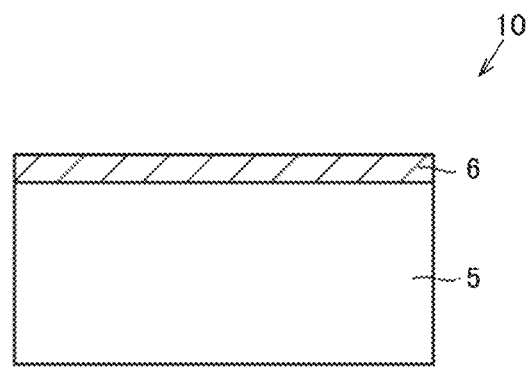
FIG. 2 is a schematic cross-sectional view of a cutting tool according to Embodiment 2.
Figure 3:
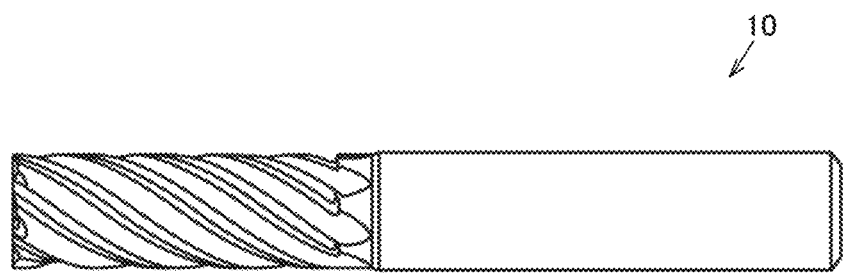
FIG. 3 is a view showing one example of a cutting tool according to Embodiment 2.

As shown in FIG. 2, the cutting tool of Embodiment 2 may include a base body 5 composed of the cemented carbide of Embodiment 1 and a coating film 6 provided on the base body 5. The coating film may be disposed so as to cover the whole surface of the base body or may be disposed so as to cover a part of the base body. When the coating film is disposed so as to cover a part of the base body, it may be disposed so as to cover at least a part of the surface of the base body involved in cutting. In the present disclosure, "part of the surface of the base body involved in cutting" means a region of the base body where a distance from a cutting edge ridgeline is within 0.5 mm.

The composition of the coating film may be a compound composed of one or more element selected from the group consisting of metal elements of groups 4, 5, and 6 in the periodic table, aluminum (Al), and silicon (Si), and one or more elements selected from the group consisting of carbon, nitrogen, oxygen, and boron. Examples thereof include TiCN, $Al_2O_3$, TiAlN, TiN, TiC, and AlCrN. In addition, the composition of the coating film may be cubic boron nitride (cBN), diamond-like carbon, or diamond. The diamond may be monocrystal diamond or polycrystalline diamond.

The coating film may be a single layer or a multilayer. A thickness of the coating film may be 0.1 μm or more and 20 μm or less, or may be 0.5 μm or more and 15 μm or less.

The coating film can be formed on the base body by a gas phase method such as a chemical vapor deposition (CVD) method or a physical vapor deposition (PVD) method.

When the coating film is formed by the CVD method, a coating film excellent in adhesiveness to the base body is easily obtained. Examples of the CVD method include a hot filament CVD method. When the coating film is formed by the PVD method, compressive residual stress is imparted, and its toughness is easily enhanced.

The cutting tool of Embodiment 2 may include a base body composed of the cemented carbide of Embodiment 1 and a cutting edge member fixed on the base body. The cutting edge member may be composed of a cubic boron nitride sintered material or a diamond. The diamond may be a monocrystal diamond or a polycrystalline diamond.

[Additional Remark 1]

The cutting tool of the present disclosure includes a base body composed of the cemented carbide of Embodiment 1 and a coating film provided on the base body,
wherein the coating film is composed of a diamond-like carbon.

EXAMPLES

The present embodiment will be described more specifically with reference to examples. However, the present embodiment is not limited by these examples.

[Production of Cemented Carbide]

A cemented carbide of each sample was produced in the following procedures.

<Preparation Step>

As the raw material powders, WC powders, TaNbC powder (average grain size: 1 μm), TiCN powder (average grain size: 1 μm), NbC powder (average grain size: 1 μm), $Ta_2O_5$ powder (average grain size: 1 μm), $TiO_2$ powder (average grain size: 1 μm), $Cr_3C_2$ powder (average grain size: 1 μm), Co powder (average grain size: 1 μm). Ni powder (average grain size: 1 μm), and Fe powder (average grain size: 1 μm) were prepared. As the WC powders, WC08 (average grain size: 0.8 μm), WC12 (average grain size: 1.2 μm), WC15 (average grain size: 1.5 μm), WC20 (average grain size: 2.0 μm), and WC06LV (average grain size: 0.6 μm) manufactured by A.L.M.T. Corp. were prepared so that each of them had an average grain size in the parentheses. As the TaNbC powder, "TaNbC 67/33" manufactured by H. C. Starck was prepared so that the average grain size was 1 μm.

<Mixing Step>

The raw material powders were mixed with a bead mill or Atritor at a proportion described in Table 1, to obtain a mixed powder. The mixing conditions using the "bead mill" were a bead diameter of 1 mm, the number of revolutions of 2,800 rpm, and a mixing time of 6 hours. The mixing conditions using the "Atritor" were the number of revolutions of 250 rpm and a mixing time of one hour.

TABLE 1

| Sample No. | WC powder Kind | Raw material powders (% by mass) | | | | | | | | | |
|---|---|---|---|---|---|---|---|---|---|---|---|
| | | WC | TaNbC | TiCN | NbC | Ta$_2$O$_5$ | TiO$_2$ | C$_{r3}$C$_2$ | Co | Ni | Fe |
| 1 | WC12 | 94.40 | 0.6 | 0 | 0 | 0 | 0 | 0 | 5 | 0 | 0 |
| 2 | WC12 | 94.52 | 0 | 0 | 0.23 | 0.25 | 0 | 0 | 5 | 0 | 0 |
| 3 | WC12 | 94.52 | 0 | 0.48 | 0 | 0 | 0 | 0 | 5 | 0 | 0 |
| 4 | WC12 | 94.41 | 0 | 0 | 0.21 | 0 | 0.38 | 0 | 5 | 0 | 0 |
| 5 | WC12 | 94.31 | 0.28 | 0 | 0 | 0 | 0.41 | 0 | 5 | 0 | 0 |
| 6 | WC08 | 94.40 | 0.6 | 0 | 0 | 0 | 0 | 0 | 5 | 0 | 0 |
| 7 | WC15 | 94.40 | 0.6 | 0 | 0 | 0 | 0 | 0 | 5 | 0 | 0 |
| 8 | WC12 | 94.40 | 0.6 | 0 | 0 | 0 | 0 | 0 | 5 | 0 | 0 |
| 9 | WC12 | 94.40 | 0.6 | 0 | 0 | 0 | 0 | 0 | 5 | 0 | 0 |
| 10 | WC12 | 94.40 | 0.6 | 0 | 0 | 0 | 0 | 0 | 5 | 0 | 0 |
| 11 | WC12 | 94.40 | 0.6 | 0 | 0 | 0 | 0 | 0 | 5 | 0 | 0 |
| 12 | WC12 | 94.75 | 0.28 | 0 | 0 | 0 | 0 | 0 | 5 | 0 | 0 |
| 13 | WC12 | 93.78 | 1.22 | 0 | 0 | 0 | 0 | 0 | 5 | 0 | 0 |
| 14 | WC12 | 94.40 | 0.6 | 0 | 0 | 0 | 0 | 0 | 2.6 | 2.4 | 0 |
| 15 | WC12 | 94.40 | 0.6 | 0 | 0 | 0 | 0 | 0 | 2.6 | 0 | 2.4 |
| 16 | WC12 | 94.60 | 0.6 | 0 | 0 | 0 | 0 | 0 | 4.8 | 0 | 0 |
| 17 | WC12 | 92.20 | 0.6 | 0 | 0 | 0 | 0 | 0 | 7.2 | 0 | 0 |
| 18 | WC12 | 94.30 | 0.6 | 0 | 0 | 0 | 0 | 0.10 | 5 | 0 | 0 |
| 19 | WC12 | 93.85 | 0.6 | 0 | 0 | 0 | 0 | 0.55 | 5 | 0 | 0 |
| 20 | WC12 | 93.80 | 0.6 | 0 | 0 | 0 | 0 | 0.60 | 5 | 0 | 0 |
| 21 | WC06LV | 94.40 | 0.6 | 0 | 0 | 0 | 0 | 0 | 5 | 0 | 0 |
| 22 | WC20 | 94.40 | 0.6 | 0 | 0 | 0 | 0 | 0 | 5 | 0 | 0 |
| 23 | WC12 | 94.40 | 0.6 | 0 | 0 | 0 | 0 | 0 | 5 | 0 | 0 |
| 24 | WC12 | 94.40 | 0.6 | 0 | 0 | 0 | 0 | 0 | 5 | 0 | 0 |
| 25 | WC12 | 94.40 | 0.6 | 0 | 0 | 0 | 0 | 0 | 5 | 0 | 0 |
| 26 | WC12 | 94.40 | 0.6 | 0 | 0 | 0 | 0 | 0 | 5 | 0 | 0 |
| 27 | WC12 | 94.77 | 0.23 | 0 | 0 | 0 | 0 | 0 | 5 | 0 | 0 |
| 28 | WC12 | 93.76 | 1.24 | 0 | 0 | 0 | 0 | 0 | 5 | 0 | 0 |
| 29 | WC12 | 94.40 | 0.6 | 0 | 0 | 0 | 0 | 0 | 2.4 | 2.6 | 0 |
| 30 | WC12 | 94.80 | 0.6 | 0 | 0 | 0 | 0 | 0 | 4.6 | 0 | 0 |
| 31 | WC12 | 92.00 | 0.6 | 0 | 0 | 0 | 0 | 0 | 7.4 | 0 | 0 |

<Molding Step>

The mixed powder was pressed to obtain a round bar-shaped molded body.

<Sintering Step>

The molded body was heated to a temperature described in the column of "Retention" of the "Sintering" in Table 2, and was retained at that temperature for time described in the column of "Retention". The temperature increase rate at 1,000° C. or more is as described in the column of the "Temperature increase rate at 1,000° C. or more". The pressure at the time of retention was under vacuum (vac) or under the condition of N$_2$ (flow rate of 2 L/min, partial pressure of 5 kPa, described as "N$_2$ (2 L-5 kPa)" in the table).

Next, it was cooled to 1,200° C. at the temperature decrease rate described in the column of the "Temperature decrease rate" in Table 2, to obtain a cemented carbide intermediate.

Next, the cemented carbide intermediate was subjected to a HIP treatment. Specifically, a temperature of 1,320° C. and a pressure of 10 MPa were applied to the cemented carbide intermediate for 60 minutes using Ar gas as a pressure medium. Then, it was gradually cooled to obtain a cemented carbide of each sample.

TABLE 2

| | | Sintering | | | Film formation | |
|---|---|---|---|---|---|---|
| Sample No. | Mixing | Temperature increase rate at 1,000° C. or more | Retention | Temperature decrease rate | Kind | Film thickness μm |
| 1 | Bead mill | 5° C./min | 1500° C./vac-120 min | −5° C./min | DLC | 0.5 |
| 2 | Bead mill | 5° C./min | 1500° C./N$_2$(2L-5 kPA) · 120 min | −5° C./min | DLC | 0.5 |
| 3 | Bead mill | 5° C./min | 1500° C./N$_2$(2L-5 kPA) · 120 min | −5° C./min | DLC | 0.5 |
| 4 | Bead mill | 5° C./min | 1500° C./N$_2$(2L-5 kPA) · 120 min | −5° C./min | DLC | 0.5 |
| 5 | Bead mill | 5° C./min | 1500° C./N$_2$(2L-5 kPA) · 120 min | −5° C./min | DLC | 0.5 |
| 6 | Bead mill | 5° C./min | 1500° C./vac-120 min | −5° C./min | DLC | 0.5 |
| 7 | Bead mill | 5° C./min | 1500° C./vac-120 min | −5° C./min | DLC | 0.5 |
| 8 | Bead mill | 5° C./min | 1450° C./vac-120 min | −5° C./min | DLC | 0.5 |
| 9 | Bead mill | 5° C./min | 1520° C./vac-120 min | −5° C./min | DLC | 0.5 |
| 10 | Bead mill | 5° C./min | 1500° C./vac-120 min | −4.5° C./min | DLC | 0.5 |

TABLE 2-continued

Table 2

| | | Sintering | | | Film formation | |
|---|---|---|---|---|---|---|
| | | Temperature increase rate at 1,000° C. or more | Retention | Temperature decrease rate | Kind | Film thickness μm |
| Sample No. | Mixing | | | | | |
| 11 | Bead mill | 5° C./min | 1500° C./vac-120 min | −5.5° C./min | DLC | 0.5 |
| 12 | Bead mill | 5° C./min | 1500° C./vac-120 min | −5° C./min | DLC | 0.5 |
| 13 | Bead mill | 5° C./min | 1500° C./vac-120 min | −5° C./min | DLC | 0.5 |
| 14 | Bead mill | 5° C./min | 1500° C./vac-120 min | −5° C./min | DLC | 0.5 |
| 15 | Bead mill | 5° C./min | 1500° C./vac-120 min | −5° C./min | DLC | 0.5 |
| 16 | Bead mill | 5° C./min | 1500° C./vac-120 min | −5° C./min | DLC | 0.5 |
| 17 | Bead mill | 5° C./min | 1500° C./vac-120 min | −5° C./min | DLC | 0.5 |
| 18 | Bead mill | 5° C./min | 1500° C./vac-120 min | −5° C./min | DLC | 0.5 |
| 19 | Bead mill | 5° C./min | 1500° C./vac-120 min | −5° C./min | DLC | 0.5 |
| 20 | Bead mill | 5° C./min | 1500° C./vac-120 min | −5° C./min | DLC | 0.5 |
| 21 | Atritor | 10° C./min | 1380° C./vac-60 min | −20° C./min | DLC | 0.5 |
| 22 | Atritor | 10° C./min | 1380° C./vac-60 min | −20° C./min | DLC | 0.5 |
| 23 | Bead mill | 10° C./min | 1380° C./vac-60 min | −20° C./min | Diamond | 8 |
| 24 | Atritor | 5° C./min | 1500° C./vac-120 min | −5° C./min | Diamond | 8 |
| 25 | Atritor | 10° C./min | 1380° C./vac-60 min | −20° C./min | DLC | 0.5 |
| 26 | Atritor | 10° C./min | 1380° C./vac-60 min | −20° C./min | DLC | 0.5 |
| 27 | Atritor | 10° C./min | 1380° C./vac-60 min | −20° C./min | DLC | 0.5 |
| 28 | Atritor | 10° C./min | 1380° C./vac-60 min | −20° C./min | DLC | 0.5 |
| 29 | Atritor | 10° C./min | 1380° C./vac-60 min | −20° C./min | DLC | 0.5 |
| 30 | Atritor | 10° C./min | 1380° C./vac-60 min | −20° C./min | DLC | 0.5 |
| 31 | Atritor | 10° C./min | 1380° C./vac-60 min | −20° C./min | DLC | 0.5 |

[Evaluation of Cemented Carbide]
<Content of Second Hard Phase and Content of Binder Phase of Cemented Carbide>

A content of the second hard phase and a content of the binder phase in the cemented carbide of each sample were measured. A specific measurement method is as described in Embodiment 1. The results are shown in the column of "Content" of "Second hard phase" and "Content" of "Binder phase" of "Cemented carbide" in Table 3. Note that, in all the samples, there was the first hard phase except for the second hard phase and the binder phase.

<D10 and D90 of Grain Sizes of Tungsten Carbide Grains>

In the cemented carbide of each sample, the D10 and the D90 of grain sizes of the tungsten carbide grains were measured. A specific measurement method is as described in Embodiment 1. The results are shown in the columns of "D10" and "D90" of "First hard phase" of "Cemented carbide" in Table 3.

<Composition of Second Hard Phase>

In the cemented carbide of each sample, the composition of the second hard phase was measured. A specific measurement method is as described in Embodiment 1. The results are shown in the column of "Composition" of "Second hard phase" of "Cemented carbide" in Table 3.

<Average of Circularities of Second Hard Phases and Standard Deviation of Circularity>

In a cross section of the cemented carbide of each sample, an average of circularities of areas of the second hard phases and a standard deviation of the circularity of the second hard phase were measured. A specific measurement method is as described in Embodiment 1. The results are shown in the columns of "Average" and "Standard deviation" of "Circularity" of "Second hard phase" of "Cemented carbide" in Table 3.

<Composition of Binder Phase>

In the cemented carbide of each sample, the composition of the binder phase and the cobalt content of the binder phase were measured. A specific measurement method is as described in Embodiment 1. The results are shown in the columns of "Composition" and "Co content" of "Binder phase" of "Cemented carbide" in Table 3.

<Chromium Content of Cemented Carbide>

The chromium content of the cemented carbide of each sample was measured. A specific measurement method is as described in Embodiment 1. The results are shown in the column of "Cr content" of "Cemented carbide" in Table 3.

TABLE 3

Table 3

| | Cemented carbide | | | | | | | | | | Cutting test |
|---|---|---|---|---|---|---|---|---|---|---|---|
| | First hard phase | | | Second hard phase | | | | Binder phase | | Cr | Wear |
| | | | | | Circularity | | Content | | Co | | |
| Sample No. | D10 μm | D90 μm | Composition | | Average | Standard deviation | % by volume | Composition | content % by mass | Content % by volume | Content % by mass | amount μm |
| 1 | 0.62 | 1.66 | TaNbC | 0.25 | 0.123 | 0.77 | Co | 100 | 8.5 | 0 | 46 |
| 2 | 0.59 | 1.58 | TaNbCN | 0.30 | 0.098 | 0.96 | Co | 100 | 8.4 | 0 | 48 |
| 3 | 0.58 | 1.55 | TiCN | 0.26 | 0.119 | 1.38 | Co | 100 | 8.4 | 0 | 47 |

TABLE 3-continued

Table 3

| | Cemented carbide | | | | | | | | | Cutting test |
|---|---|---|---|---|---|---|---|---|---|---|
| | First hard phase | | Second hard phase | | | Binder phase | | | Cr Content | Wear |
| | | | | Circularity | Content | | Co content | Content | | |
| Sample No. | D10 μm | D90 μm | Composition | Average | Standard deviation | % by volume | Composition | % by mass | % by volume | % by mass | amount μm |
|---|---|---|---|---|---|---|---|---|---|---|---|
| 4 | 0.57 | 1.52 | TiNbCN | 0.30 | 0.095 | 1.53 | Co | 100 | 8:4 | 0 | 47 |
| 5 | 0.61 | 1.63 | TaNbC TiCN | 0.29 | 0.103 | 1.58 | Co | 100 | 8.3 | 0 | 46 |
| 6 | 0.41 | 1.11 | TaNbC | 0.13 | 0.124 | 0.79 | Co | 100 | 8.5 | 0 | 46 |
| 7 | 0.75 | 1.98 | TaNbC | 0.23 | 0.127 | 0.77 | | 100 | 8.5 | 0 | 50 |
| 8 | 0.47 | 1.27 | TaNbC | 0.11 | 0,123 | 0.75 | Co | 100 | 8.4 | 0 | 47 |
| 9 | 0.73 | 1.96 | TaNbC | 0.31 | 0.096 | 0.85 | Co | 100 | 8.3 | 0 | 48 |
| 10 | 0.69 | 1.84 | TaNbC | 0.30 | 0.094 | 0.77 | Co | 100 | 85 | 0 | 45 |
| 11 | 0.51 | 1.38 | TaNbC | 0.19 | 0.129 | 0.78 | Co | 100 | 8.5 | 0 | 49 |
| 12 | 0.54 | 1.72 | TaNbC | 0.10 | 0.128 | 0.32 | Co | 100 | 8.4 | 0 | 48 |
| 13 | 0.54 | 1.43 | TaNbC | 0.29 | 0.106 | 1.58 | Co | 100 | 8.4 | 0 | 46 |
| 14 | 0.48 | 1.30 | TaNbC | 0.17 | 0.120 | 0.77 | Co, Ni | 51 | 8.4 | 0 | 50 |
| 15 | 0.49 | 1.32 | TaNbC | 0.17 | 0.120 | 0.78 | Co, Fe | 51 | 8.7 | 0 | 52 |
| 16 | 0.51 | 1.38 | TaNbC | 0.20 | 0.102 | 0.75 | Co | 100 | 8.1 | 0 | 45 |
| 12 | 0.59 | 1.58 | TaNbC | 0.13 | 0.127 | 0.77 | Co | 100 | 11.8 | 0 | 50 |
| 18 | 0.48 | 1.30 | TaNbC | 0.18 | 0.119 | 0.78 | Co | 100 | 8.3 | 0.08 | 38 |
| 19 | 0.47 | 1.27 | TaNbC | 0.17 | 0.120 | 0.78 | Co | 100 | 8:3 | 0.48 | 40 |
| 20 | 0.46 | 1.24 | TaNbC | 0.16 | 0.121 | 0.79 | Co | 100 | 8.4 | 0.58 | 47 |
| 21 | 0.39 | 1.05 | TaNbC | 0.12 | 0.130 | 0.79 | Co | 100 | 8.4 | 0 | Occurrence of chipping |
| 22 | 0.74 | 2.02 | TaNbC | 0.27 | 0.114 | 0.8 | Co | 1.00 | 8.3 | 0 | 66 |
| 23 | 0.64 | 1.72 | TaNbC | 0.33 | 0.095 | 0.81 | Co | 100 | 8.5 | 0 | 64 |
| 24 | 0.62 | 1.66 | TaNbC | 0.09 | 0.124 | 0.81 | Co | 100 | 8.4 | 0 | 65 |
| 25 | 0.46 | 1.24 | TaNbC | 0.16 | 0.093 | 0.8 | Co | 100 | 8.6 | 0 | 65 |
| 26 | 0.47 | 1.27 | TaNbC | 0.17 | 0.132 | 0.82 | Co | 100 | 8.5 | 0 | 68 |
| 27 | 0.48 | 1.30 | TaNbC | 0.14 | 0.125 | 0.27 | Co | 100 | 8.4 | 0 | 69 |
| 28 | 1.49 | 1.32 | TaNbC | 0.24 | 0.129 | 1.63 | Co | 100 | 8.5 | 0 | 66 |
| 29 | 0.44 | 1.19 | TaNbC | 0.16 | 0.102 | 0.8 | Co, Ni | 47 | 8.3 | 0 | 72 |
| 30 | 0.50 | 1.35 | TaNbC | 0.22 | 0.124 | 0.83 | Co | 100 | 7.9 | 0 | Occurrence of chipping |
| 31 | 0.59 | 1.58 | TaNbC | 0.13 | 0.128 | 0.78 | Co | 100 | 12.1 | 0 | 70 |

[Production of Cutting Tool]

A round bar composed of the cemented carbide of each sample was processed, to produce a base body with a shape of an end mill (model number: ASM4100DL).

In a sample described as "DLC" in the column of "Kind" of "Film formation" in Table 2, a coating film composed of a diamond-like carbon was formed on a base body by the PVD method. A specific film formation method is as follows. The base body was mounted on a base body holder in a film formation apparatus. While argon gas was introduced into the film formation apparatus at a flow rate of 5 cc/min, a target having a triangular prism shape composed of sintered graphite ("IG-510" manufactured by TOYO TANSO CO., LTD.) was evaporated and ionized by vacuum arc discharge (cathode electric current 120 A), a voltage of −100 V was applied to the base body holder by a bias supply, and a coating film composed of the diamond-like carbon and having a thickness of 0.5 μm was formed on the base body, to thereby obtain a cutting tool. A setting temperature of a base body heater at the time of starting the film formation was 150° C. During the film formation, a power supply of the base body heater was alternately turned on and off every 30 minutes.

In a sample described as "Diamond" in the column of "Kind" of "Film formation" in Table 2, a coating film composed of a polycrystalline diamond and having a thickness of 8 μm was formed on the base body by a hot filament CVD method, to obtain a cutting tool (end mill) of each sample. The film formation conditions of the hot filament CVD method were 700° C., 500 Pa, and gases used and their flow ratio of $H_2/CH_4$=100/1.

The end mill of each sample was used to process a side surface of aluminum (ADC12). The processing conditions were a cutting rate of Vc 400 m/min, a table feed of F6000 mm/min, a cutting amount (axial direction) of ap 10 mm, a cutting amount (radius direction) of ae 2 mm, and dry processing. The wear amount at the time of processing of 40 m was measured. It is judged that the lower the wear amount, the longer the tool life. The results are shown in the column of "Wear amount" of "Cutting test" in Table 3. In this column, "Occurrence of chipping" indicates that chipping occurred on a cutting tool before processing of 40 m and the processing was stopped.

[Discussion]

The cemented carbides and the cutting tools of sample 1 to sample 20 correspond to Examples. The cemented carbides and the cutting tools of sample 21 to sample 31 correspond to Comparative Examples. It was confirmed that the cutting tools of Examples have a longer tool life than the cutting tools of Comparative Examples. It was confirmed that the cutting tools of Examples enable stable processing for a long period of time when used for processing aluminum. Because the cutting tools of Examples had an improved adhesiveness among the first hard phase, the second hard phases, and the binder phase in the cemented carbide used as a material, it is presumed that an expansion of tool damages caused by welding is suppressed even in processing aluminum.

Although the embodiments and Examples of the present disclosure have been described above, it has been planned from the beginning that the configurations of the embodiments and Examples described above may be appropriately combined or modified in various ways.

It should be understood that the embodiments and Examples disclosed herein are illustrative in all respects and are not restrictive. The scope of the present invention is defined not by the above-described embodiments and Examples but by the claims, and is intended to include meanings equivalent to the claims and all modifications within the scope.

REFERENCE SIGNS LIST

1 First hard phase; 2 Second hard phase; 3 Binder phase; 4 Cemented carbide; 5 Base body; 6 Coating film; 10 Cutting tool.

The invention claimed is:

1. A cemented carbide consisting of a first hard phase, a plurality of second hard phases, and a binder phase,
    wherein the first hard phase is composed of a plurality of tungsten carbide grains,
    a D10 of grain sizes of the tungsten carbide grains is 0.40 µm or more,
    a D90 of grain sizes of the tungsten carbide grains is 2.00 µm or less,
    the second hard phases are composed of at least one first compound selected from the group consisting of TaNbC, TaNbN, TaNbCN, TiCN, TiNbC, TiNbN, and TiNbCN,
    the cemented carbide includes 0.30% by volume or more and 1.60% by volume or less of the second hard phases,
    in a cross section of the cemented carbide, an average of circularities of the second hard phases is 0.10 or more and 0.32 or less,
    a standard deviation of the circularity is 0.094 or more and 0.130 or less,
    the binder phase includes 50% by mass or more of cobalt, and
    the cemented carbide includes 8.0% by volume or more and 12.0% by volume or less of the binder phase.

2. The cemented carbide according to claim 1, wherein the cemented carbide includes 0.08% by mass or more and 0.5% by mass or less of chromium.

3. The cemented carbide according to claim 1, wherein the binder phase includes either iron or nickel or both iron and nickel.

4. A cutting tool comprising the cemented carbide according to claim 1.

5. The cutting tool according to claim 4, comprising a base body composed of the cemented carbide and a coating film provided on the base body.

6. The cutting tool according to claim 4, comprising a base body composed of the cemented carbide and a cutting edge member fixed on the base body.

7. The cutting tool according to claim 6, wherein the cutting edge member is composed of a cubic boron nitride sintered material or a diamond.

* * * * *